(12) United States Patent
Smith (10) Patent No.: US 10,063,048 B2
(45) Date of Patent: Aug. 28, 2018

(54) DYNAMIC TRIGGER VOLTAGE CONTROL FOR AN ESD PROTECTION DEVICE

(71) Applicant: Silicon Laboratories Inc., Austin, TX (US)

(72) Inventor: Jeremy C. Smith, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 230 days.

(21) Appl. No.: 14/984,929

(22) Filed: Dec. 30, 2015

(65) Prior Publication Data

US 2017/0194788 A1    Jul. 6, 2017

(51) Int. Cl.
| | |
|---|---|
| *H02H 9/04* | (2006.01) |
| *H01L 27/02* | (2006.01) |
| *H01L 29/739* | (2006.01) |

(52) U.S. Cl.
CPC ......... *H02H 9/046* (2013.01); *H01L 27/0259* (2013.01); *H01L 27/0266* (2013.01); *H01L 27/0292* (2013.01); *H01L 29/7393* (2013.01); *H02H 9/044* (2013.01)

(58) Field of Classification Search
CPC ............. H01L 27/0259; H01L 27/0266; H01L 27/0292; H01L 29/7393; H01L 27/0251; H01L 27/0255; H01L 27/0262; H01L 23/60; H01L 27/0248; H02H 9/044; H02H 9/046; H02H 3/22
USPC .......................................................... 361/56
See application file for complete search history.

(56) References Cited

U.S. PATENT DOCUMENTS

| | | | | |
|---|---|---|---|---|
| 4,967,244 | A * | 10/1990 | Bauer ................ | H01L 29/7395 257/133 |
| 6,888,710 | B2 * | 5/2005 | Mallikarjunaswamy ................... | H01L 27/0259 257/E29.197 |
| 7,345,342 | B2 * | 3/2008 | Challa ................ | H01L 21/3065 257/341 |
| 2007/0030610 | A1 * | 2/2007 | Ker ....................... | H02H 9/046 361/56 |

(Continued)

OTHER PUBLICATIONS

Yuxi et al., "Influence of Layout Parameters on Snapback Characteristics for a Gate-Grounded NMOS Device in 0.13μm silicide CMOS Technology", Journal of Semiconductors, Aug. 2009, 8 pgs.

(Continued)

*Primary Examiner* — Thienvu Tran
*Assistant Examiner* — Nicolas Bellido
(74) *Attorney, Agent, or Firm* — Egan Peterman Enders Huston (57) ABSTRACT

Circuit configurations and related methods are provided that may be implemented using insulated-gate bipolar transistor (IGBT) device circuitry to protect at risk circuitry (e.g., such as high voltage output buffer circuitry or any other circuitry subject to undesirable ESD events) from damage due to ESD events that may occur during system assembly. The magnitude of the trigger voltage $V_{T1}$ threshold for an IGBT ESD protection device may be dynamically controlled between at least two different values so that trigger voltage $V_{T1}$ threshold for an IGBT ESD protection device may be selectively reduced when needed to better enable ESD operation.

24 Claims, 5 Drawing Sheets

(56) References Cited

U.S. PATENT DOCUMENTS

| | | | |
|---|---|---|---|
| 2007/0158678 A1* | 7/2007 | Udrea | H01L 29/0834 |
| | | | 257/119 |
| 2012/0126880 A1* | 5/2012 | Patti | H01L 29/0834 |
| | | | 327/537 |
| 2013/0141825 A1* | 6/2013 | Kitagawa | H02H 9/046 |
| | | | 361/56 |

OTHER PUBLICATIONS

Duvvury et al., "Dynamic Gate Coupling of NMOS for Efficient Output ESD Protection", IEEE, 1992, 10 pgs.

* cited by examiner

DYNAMIC TRIGGER VOLTAGE CONTROL FOR AN ESD PROTECTION DEVICE

FIELD OF THE INVENTION

This invention relates to circuitry and, more particularly, to electrostatic discharge (ESD) protection circuitry.

BACKGROUND

Figure 1:
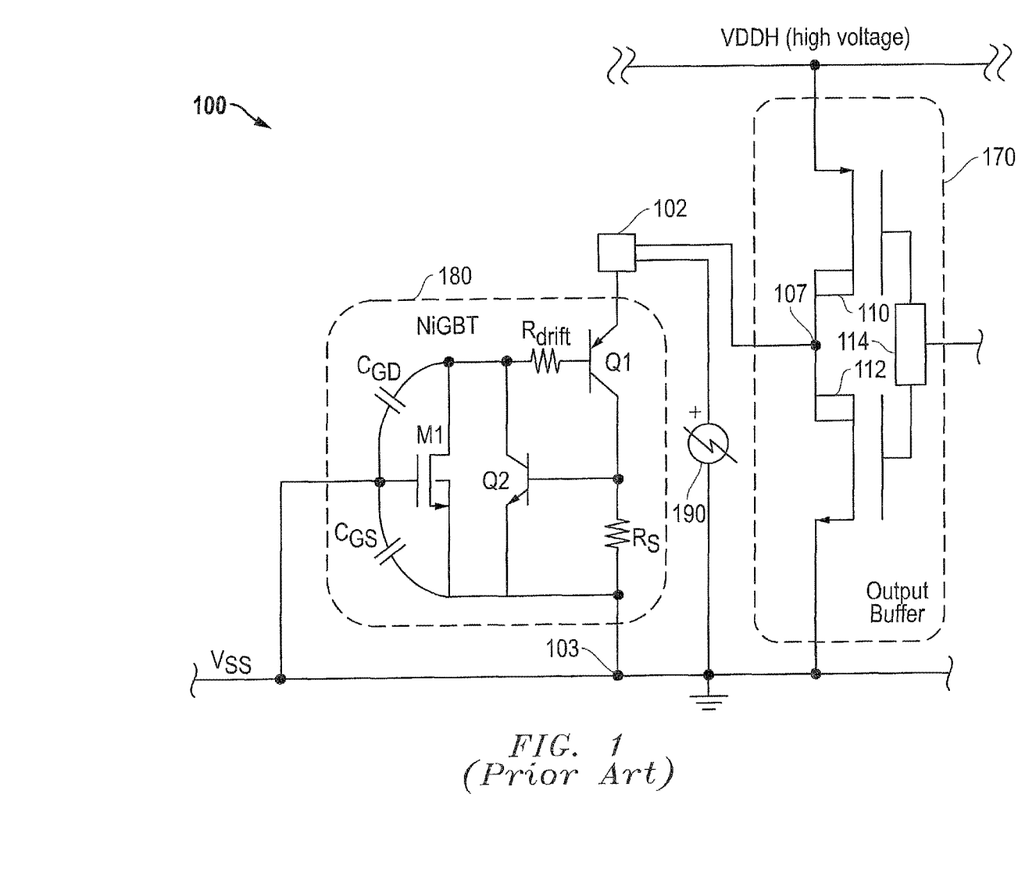
FIG. 1 illustrates conventional high voltage signal output circuitry that includes a NiGBT ESD protection device.

FIG. 1 illustrates conventional signal output circuitry 100 having a signal output signal pad 102 that is coupled to an output signal node 107 of a High Voltage (HV) output buffer circuit 170 that includes HV complementary metal-oxide semiconductor (CMOS) driver circuitry coupled between positive high voltage supply rail $V_{DDH}$ and negative supply rail $V_{SS}$ (ground) as shown. Output buffer circuit 170 includes a HV P-channel MOSFET (PMOS) output transistor 110 and a HV N-channel MOSFET (NMOS) output transistor 112 that each have a gate coupled to an internal output control circuit 114. Signal pad 102 is coupled at node 107 between the HV PMOS output transistor 110 and the HV NMOS output transistor 112 of buffer circuit 170. As further illustrated, signal output circuitry 100 is configured with a high voltage electrostatic discharge (ESD) protection device that includes an N-channel insulated-gate bipolar transistor (NiGBT) device 180 that is coupled between signal pad 102 and ground or $V_{SS}$ at node 103 as shown to form an embedded parasitic silicon controlled rectifier (SCR). NiGBT device 180 includes a NMOS transistor M1, with a PNP bipolar transistor Q1 coupled as shown between signal pad 102 and ground. NMOS transistor M1 itself is coupled between the base of PNP transistor Q1 and ground, with a parasitic NPN transistor Q2 also coupled between the base of PNP transistor Q1 and ground. As shown, the gate of NMOS transistor M1 is also coupled to ground.

The occurrence of a positive ESD event 190 on signal pad 102 causes a corresponding rise in voltage of the drift region due to the forward biased emitter-base diode of PNP transistor Q1. This voltage appears across the entire N-type drift region which begins at the base of Q1 and terminates at the drain of M1. An effective drift resistance $R_{DRIFT}$ exists between these two points where the drift region is generally engineered to be very lightly doped. The ESD potential which was originally applied to signal pad 102 now appears across the drain body diode of M1 which is reverse biased. As the ESD potential continues to rise, eventually the drain-body diode of M1 will avalanche breakdown, thereby generating electron-hole pairs in the process. When the generated holes flow to ground through the substrate resistance $R_S$, an elevation in substrate potential occurs that acts to forward bias the base-emitter junction of parasitic NPN Q2, thereby turning this device on which causes collector current to flow in Q2. The collector current in Q2 in turn causes base and collector current to flow in Q1. The collector current in Q1 acts to further elevate the potential across $R_S$ which causes a further increase in base and collector current in Q2. A positive feedback loop is formed and the parasitic SCR turns on and shunts the ESD current from signal pad 102 to ground. The voltage at which the parasitic SCR turns on is called $V_{T1}$ and is set entirely here by the breakdown voltage of the drift region to body-diode of transistor M1. In general $V_{T1}$ must be set higher than the normal operating voltage of the output buffer circuit 170 that NiGBT device 180 is protecting. Often times in high voltage processes, the $V_{T1}$ of the protection device is also very close in magnitude to the voltage at which the HV NMOS and HV PMOS output devices themselves are damaged and great care must be taken to ensure that the ESD device triggers before an output buffer device.

SUMMARY

Disclosed herein are circuit configurations and related methods that may be implemented using insulated-gate bipolar transistor (IGBT) device circuitry to protect at risk circuitry (e.g., such as high voltage output buffer circuitry or any other circuitry subject to undesirable ESD events) from damage due to ESD events. The ESD events described herein, occur during assembly of integrated circuits onto printed circuit boards and as such, occur when the chip is in an unpowered state. Using the disclosed circuitry and methods, the magnitude of the trigger voltage $V_{T1}$ threshold for an IGBT ESD protection device may be dynamically controlled between at least two different values, e.g., a first low trigger voltage threshold and a second high trigger voltage threshold that is higher than the first low trigger voltage threshold. In this way, trigger voltage $V_{T1}$ threshold for an IGBT ESD protection device may be selectively reduced to guarantee that it is significantly lower than the failure voltage of the devices that it is protecting.

In one exemplary embodiment, the disclosed circuitry and methods may be implemented to control the trigger voltage of an IGBT ESD protection device to be a lower trigger voltage threshold value that is less than or equal to the normal operating voltage of the protected circuitry during an unpowered condition of the at risk circuitry, e.g., so as to sufficiently protect the unpowered at risk circuitry from ESD events that may occur during circuit fabrication and system assembly. In this same embodiment, the disclosed circuitry and methods may be implemented to dynamically control the trigger voltage of the IGBT ESD protection device to be a higher trigger voltage threshold value that is greater than the normal operating voltage of the at risk circuitry during a powered condition, e.g., so as to prevent the normal operating voltage of the at risk circuitry from triggering the IGBT ESD protection device. The disclosed circuitry and methods may be implemented in one exemplary embodiment to protect high voltage at risk circuitry, e.g., such as signal output circuitry having a normal operating voltage that is less than about 150 volts and greater than or equal to about 50 volts.

In one respect, disclosed herein is a semiconductor circuit device, including: a signal pad; a first supply rail; an insulated-gate bipolar transistor (IGBT) device coupled to form an embedded parasitic silicon controlled rectifier (SCR) between the signal pad and the first supply rail; a resistor coupled in a first current path between a gate of the IGBT device and the first supply rail; a switching element coupled in a second current path between the gate of the IGBT device and the first supply rail, the second current path being parallel to the first current path; where the switching element is configured to selectively couple the gate of the IGBT device to the first supply rail through the second current path to lower a resistance to current flow between the gate of the IGBT device and the first supply rail.

In another respect, disclosed herein is a method, including: operating a semiconductor circuit device that includes an insulated-gate bipolar transistor (IGBT) device that is coupled to form an embedded parasitic silicon controlled rectifier (SCR) between a signal pad and a first supply rail of a circuit device, a resistor being coupled in a first current path between a gate of the IGBT device and the first supply rail, and a switching element being coupled in a second current path between the gate of the IGBT device and the first supply rail such that the second current path is parallel to the first current path; and using the switching element to selectively couple the gate of the IGBT device to the first supply rail through the second current path to lower a resistance to current flow between the gate of the IGBT device and the first supply rail.

DESCRIPTION OF ILLUSTRATIVE EMBODIMENTS

Figure 2A:
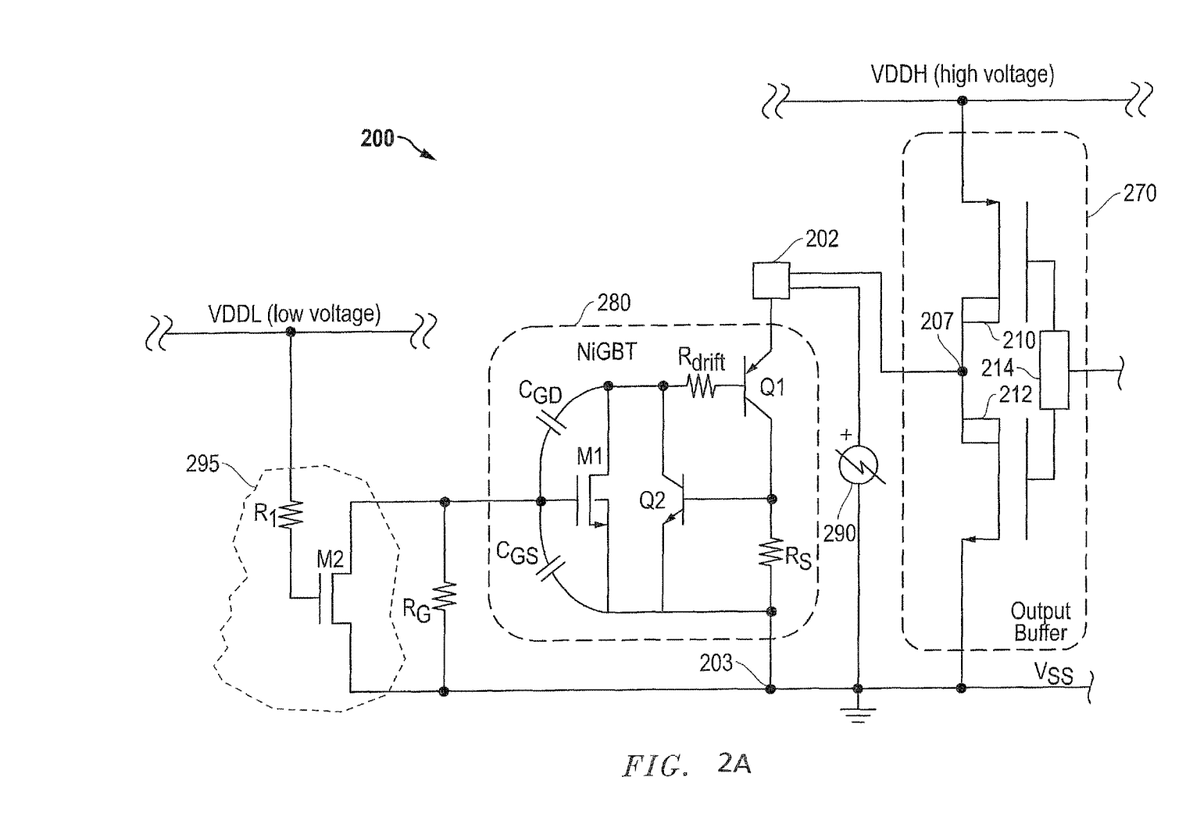
FIG. 2A illustrates signal output circuitry 200 according to one exemplary embodiment of the disclosed circuitry and methods.
Figure 2B:
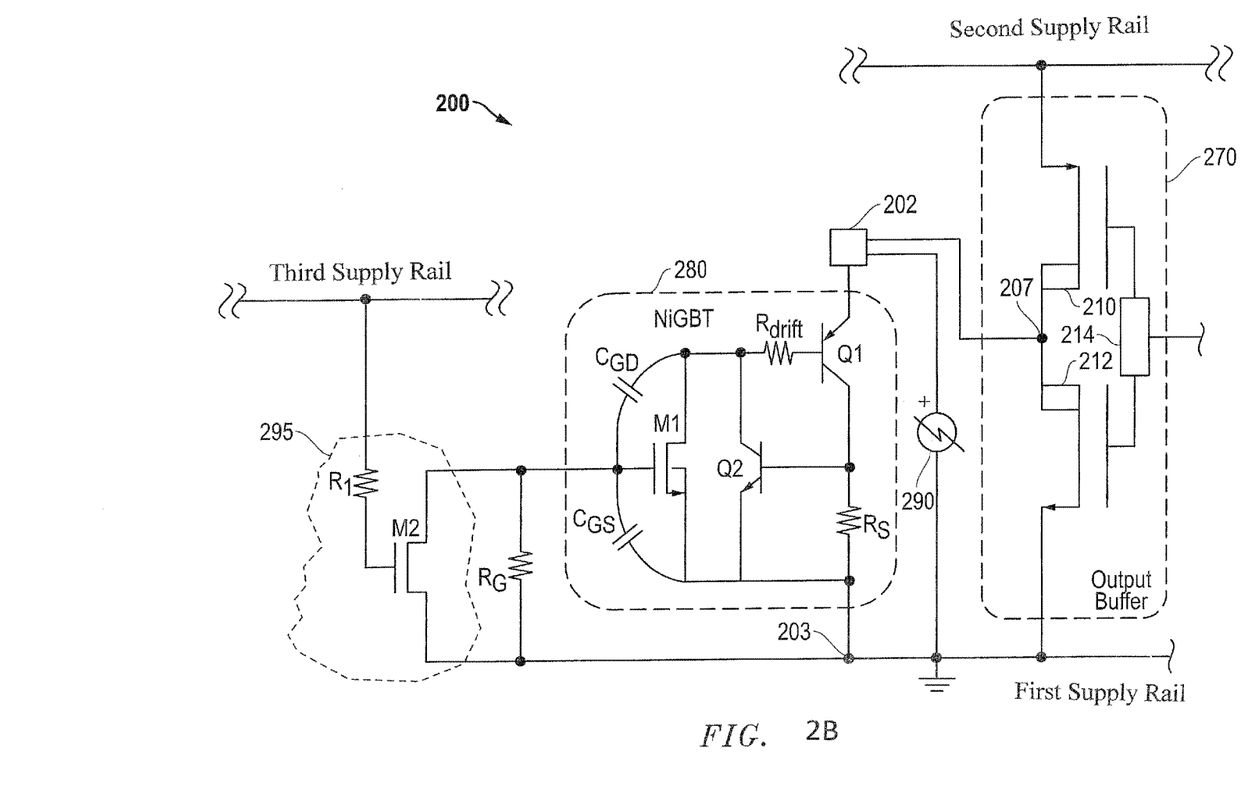
FIG. 2B illustrates signal output circuitry 200 according to another exemplary embodiment of the disclosed circuitry and methods.

FIG. 2A illustrates signal output circuitry 200 according to one exemplary embodiment of the disclosed circuitry and methods. FIG. 2B illustrates signal output circuitry 200 according to another exemplary embodiment of the disclosed circuitry and methods. Signal output circuitry 200 may in one embodiment be a part of the integrated circuitry of an integrated subscriber line interface circuit (SLIC) chip or other silicon-on-insulator (SOI) integrated circuit, although the disclosed circuitry and methods may be implemented with other types of integrated circuitry as well. As shown in FIG. 2A, circuitry 200 includes a signal output signal pad 202 that is coupled to an output signal node 207 of an output buffer circuit 270 that includes HV complementary metal-oxide semiconductor (CMOS) driver circuitry coupled between positive high voltage supply rail $V_{DDH}$ and $V_{SS}$ (ground) as shown. Output buffer circuit 270 includes a HV P-channel MOSFET (PMOS) output transistor 210 and a HV N-channel MOSFET (NMOS) output transistor 212 that each have a gate coupled to an internal output control circuit 214. Signal pad 202 is coupled at node 207 between the HV PMOS output transistor 210 and the HV NMOS output transistor 212 of buffer circuit 270. As further illustrated, signal output circuitry 200 is configured with a high voltage electrostatic discharge (ESD) protection device that includes an N-channel insulated-gate bipolar transistor (NiGBT) circuit device 280 that is coupled between signal pad 202 and ground or $V_{SS}$ at node 203 as shown to form an embedded parasitic silicon controlled rectifier (SCR). NiGBT circuit device 280 includes a NMOS transistor M1, with a PNP bipolar transistor Q1 coupled as shown between signal pad 202 and ground. NMOS transistor M1 itself is coupled between the base of PNP transistor Q1 and ground, with a parasitic NPN transistor Q2 also coupled between base of PNP transistor Q1 and ground to form the SCR. As shown, the gate of NMOS transistor M1 is also coupled to ground through series gate resistor $R_G$ that has a non-zero resistance (e.g., high value resistor such as about 20 kilo ohms in one exemplary embodiment).

Also shown in FIG. 2A is gate control circuit 295 that includes a gate coupling switch that is coupled in parallel with gate resistor $R_G$ between the gate of NMOS transistor M1 and ground, and that is configured to selectively close to short the gate of NiGBT NMOS transistor M1 to ground when signal output circuitry 200 is powered on. When the signal output circuitry 200 is powered off, the gate coupling switch is configured to remain open so that the only current path between ground and the gate of NiGBT NMOS transistor M1 is through gate resistor $R_G$ which operates to lower the trigger voltage of the NiGBT device 280 as described further herein. In the particular illustrated embodiment of FIG. 2A, the gate coupling switch is an NMOS transistor M2 that has its gate coupled to positive low voltage supply rail $V_{DDL}$ of signal output circuitry 200 via resistor $R_1$ (e.g., about 5K ohms in one exemplar embodiment) that may be present, for example, to reduce gate oxide stress during ESD events on the $V_{DDL}$ supply. It will be understood that in other embodiments a gate control circuit may be any other suitable type of switching element, e.g., such as PMOS transistor with inverter coupled between the gate of the PMOS transistor and positive low voltage supply rail $V_{DDL}$ of signal output circuitry 200, etc.

In one embodiment, high voltage supply rail $V_{DDH}$ may be present for purposes of supplying high voltage power from an external source to HV signal interface power-consuming circuitry of a chip on which signal output circuitry 200 is integrated, while low voltage supply rail $V_{DDL}$ may be present for purposes of supplying low voltage power from an external source to logic and control power-consuming circuitry of a chip on which signal output circuitry 200 is integrated. In this regard, it will be understood that high voltage supply rail $V_{DDH}$ may be operated at any voltage that is relatively higher than the voltage of low voltage supply rail $V_{DDL}$. For example, in one exemplary embodiment, high voltage supply rail $V_{DDH}$ may be operated at a voltage of less than or equal to about 150 volts but greater than or equal to about 50 volts, and low voltage supply rail $V_{DDL}$ may be operated at a voltage of about 5 volts or less, although in other embodiments $V_{DDH}$ and $V_{DDL}$ may be operated at any other respective voltages such that $V_{DDH}$ is higher than a corresponding voltage of $V_{DDL}$ of the same embodiment.

However, high voltage supply rail $V_{DDH}$ may be operated at any other voltage that is relatively higher than a corresponding operating voltage of low voltage supply rail $V_{DDL}$. For example, the disclosed circuitry and methods may be implemented in other embodiments for signal output circuitry having a normal operating voltage that is greater than about 140 volts, alternatively greater than about 130 volts, alternatively greater than about 120 volts, alternatively greater than about 110 volts, alternatively greater than about 100 volts, and further alternatively from about 100 volts to about 200 volts. However, it will be understood that the the disclosed circuitry and methods may be implemented in other embodiments for signal output circuitry having a normal operating voltage that is less than 100 volts or greater than 200 volts.

Still referring to FIG. 2A, occurrence of a positive ESD event 290 on signal pad 202 causes a rise in voltage on the gate of NMOS transistor M1 due to capacitive coupling, the magnitude of which is determined in part by a capacitive voltage divider formed with the gate-to-drain capacitance ($C_{GD}$) and the gate-to-source capacitance ($C_{GS}$). An effective feedthrough ratio is thereby formed, where a fractional portion of the ESD potential appearing on pad 202 will appear between the gate and ground of NMOS transistor M1. In general the feedthrough ratio must be chosen to couple enough of the applied ESD potential onto the gate of M1 to form a channel but not too high of a potential as to cause gate oxide damage. At the critical ESD trigger voltage ($V_{T1}$) on signal pad 202 which causes the ESD-induced voltage on the gate of NMOS transistor M1 to exceed its MOS-threshold voltage ($V_T$), NMOS transistor M1 turns on to allow initial current flow from base of PNP transistor Q1 through drift region resistance $R_{DRIFT}$ to ground, which in turn causes PNP transistor Q1 to begin to conduct ESD event current from pad 202 to ground through source resistance ($R_S$). Current conducted through PNP transistor Q1 also flows into base of parasitic NPN transistor Q2 causing NPN transistor Q2 to conduct current from base of PNP transistor Q1 through drift region resistance $R_{DRIFT}$ to ground. Thus a positive feedback loop is formed as before and the parasitic SCR is in a locked-on state. The parasitic SCR stays locked until the ESD event charge is discharged from pad 202 through PNP transistor Q1.

In the embodiment of FIG. 2A, the magnitude of NiGBT trigger voltage ($V_{T1}$) varies inversely with the magnitude of resistance coupled between the gate of NMOS transistor M1 and ground. Thus, when signal output circuitry 200 and low voltage supply rail $V_{DDL}$ of signal output circuitry 200 is unpowered, NMOS switching element is off (or open) so that resistance between the gate of NMOS transistor M1 and ground is equal to $R_G$, which acts to lower $V_{T1}$ (e.g., to about 80 volts in one exemplary embodiment). This may be advantageously implemented to sufficiently lower the NiGBT trigger voltage ($V_{T1}$) during circuit fabrication and assembly to ensure that the NiGBT device 280 is triggered during an ESD event and before the unpowered buffer circuit 270 (that the NiGBT device 280 is protecting) is triggered, which is desirable since breakdown voltage of output transistors 210 and 212 may otherwise be close to the trigger voltage $V_{T1}$ of the NiGBT device 280. It will be understood that the particular lowered value of $V_{T1}$ may vary in other embodiments (e.g., may be greater than or less than 80 volts) based on the characteristics of a given NiGBT device 280 in combination with a particular selected resistance value of $R_G$ that is selected for a given circuit at risk.

However, when signal output circuitry 200 is powered on (e.g., to about 150 volts in one exemplary embodiment), low voltage supply rail $V_{DDL}$ of signal output circuitry 200 is powered on. In this case, NMOS switching element is turned on (or closed) so that the gate of NMOS transistor M1 is shorted (and strongly coupled) to ground, e.g., similar to wiring the gate of M1 to ground. This in turn acts to raise $V_{T1}$ to a value (e.g., to about 155 volts in one exemplary embodiment) that is greater than the normal operating voltage of the output buffer circuit 270 that the NiGBT device 280 is protecting. Thus, when signal output circuitry 200 (and $V_{DDL}$) is powered on, NiGBT trigger voltage ($V_{T1}$) is controlled to be a value that is greater than the normal operating voltage of the output buffer circuit 270 that the NiGBT device 280 is protecting so that NiGBT device 280 does not discharge current from pad 202 under normal operating voltage conditions in the absence of ESD event 290. It will be understood that the particular raised value of $V_{T1}$ may vary in other embodiments (e.g., may be greater than or less than 155 volts) based on the characteristics of a given NiGBT device 280.

Figure 3:
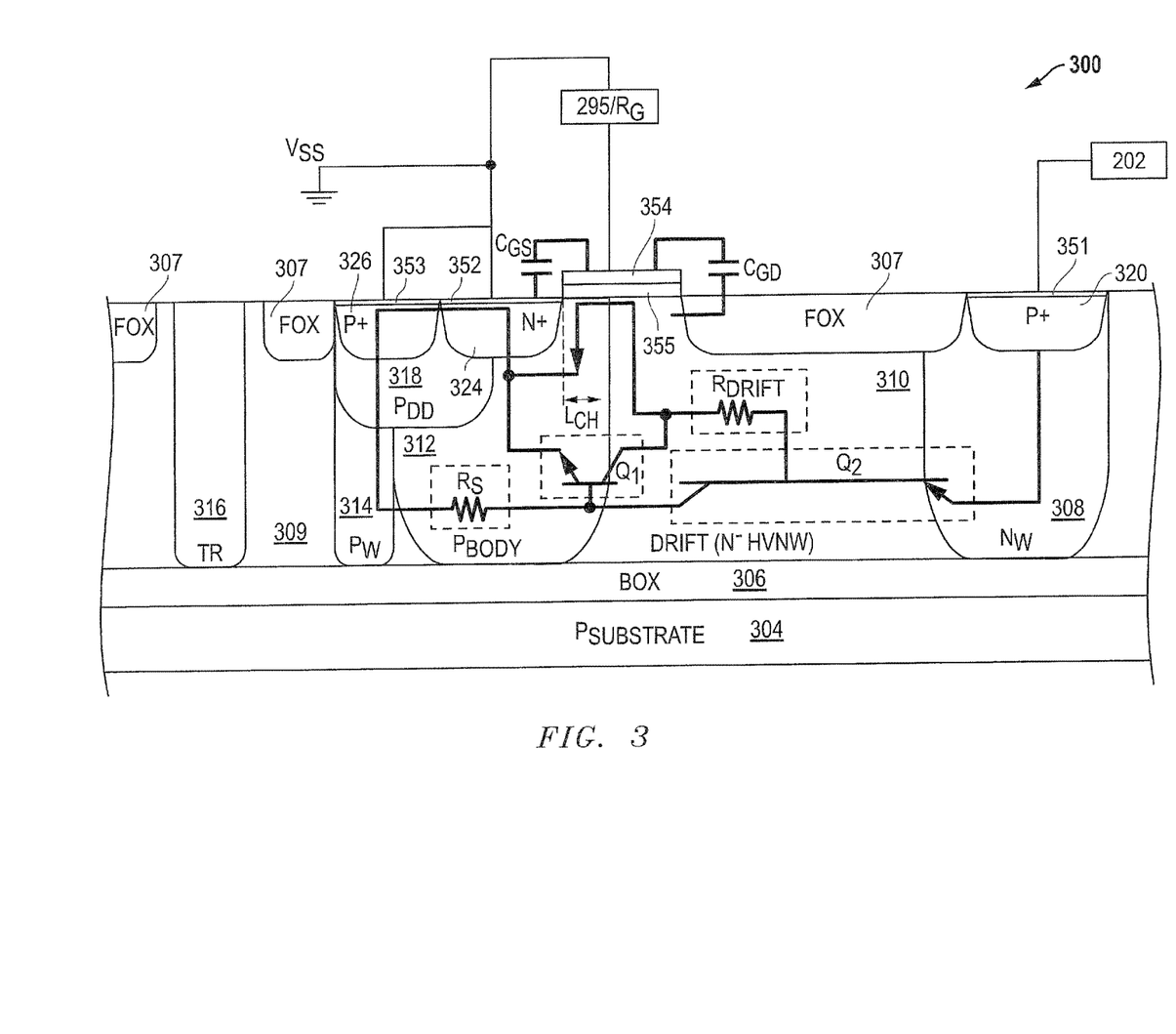
FIG. 3 illustrates a partial cross section of a silicon-on-insulator (SOI) device structure of a NiGBT circuit device according to one exemplary embodiment of the disclosed circuitry and methods.

FIG. 3 illustrates a partial cross section of a silicon-on-insulator (SOI) device structure 300 of NiGBT circuit device 280 according to one exemplary embodiment. In this embodiment, NiGBT structure 300 includes a buried oxide (e.g., BOX) layer 306 and top silicon semiconductor layer 309 (e.g., silicon or germanium-based) formed on P-type substrate 304. In this embodiment, a P+ type body region 312 and Nwell 308 (that are separated by a lightly doped (N−) high voltage Nwell drift region 310) are formed in top silicon semiconductor layer 309 above BOX (e.g., silicon dioxide) layer 306 as shown. As further shown, a Pwell 314 is formed in top silicon semiconductor layer 309 adjacent P+ body region 312, and a $P_{DD}$ region 318 is formed in Pwell 314 and P+ body region 312. P+ doped region 320 is formed within Nwell 308 to form an anode of NiGBT device structure 300 that is coupled to signal output signal pad 202 by conductive (e.g., metal) pad 351. N+ doped region 324 and P+ doped region 326 are formed within lightly doped $P_{DD}$ region 318 and Pwell 314 to form a cathode of NiGBT device structure 300 that is coupled to ground via conductive (e.g., metal) pads 353 and 352 as shown. In this configuration, N+ doped region 324 forms a source terminal for NMOS transistor M1, P+ doped region 326 forms a body terminal for NMOS transistor M1, while Nwell drift region 310 and Nwell 308 together form a drain for NMOS transistor M1. Conductive (e.g., metal) gate terminal 354 and gate oxide 355 for NMOS transistor M1 are formed as shown above P+ body region 312 and Nwell drift region 310, with gate terminal 354 being coupled as shown to ground via gate control circuit 295 and parallel gate resistor $R_G$. Also present in FIG. 3 are field oxide regions 307 and deep trench isolation region 316 that is formed in top silicon semiconductor layer 309.

Still referring to FIG. 3, PNP bipolar transistor Q1 and parasitic NPN bipolar transistor Q2 elements of NiGBT device 280 of FIG. 2A are illustrated in relation to the respective components of NiGBT device structure 300 of FIG. 3. Also illustrated are gate-to-drain capacitance ($C_{GD}$) and gate-to-source capacitance ($C_{GS}$) of NMOS transistor M1 that were also described in relation to FIG. 2A. Noted here is that since the body of NMOS transistor M1 is shorted in metal to its source $C_{GS}$=gate-to-body capacitance ($C_{GB}$). As shown in FIG. 3, the channel length ($L_{CH}$) of NMOS transistor M1 is defined by the distance that gate 354 overlaps P+ body region 312, and gate-to-source capacitance ($C_{GS}$) of NMOS transistor M1 is determined by the value of $L_{CH}$, which in turn affects the magnitude of feedthrough voltage ratio. In general, the feedthrough ratio of ESD potentials coupled from the pad onto the gate of M1 is proportional to $C_{GD}/(C_{GD}+C_{GS})$. Thus, as the value of $L_{CH}$ (and $C_{GS}$) decreases for fixed $C_{GD}$, the feedthrough ratio increases and a larger fraction of the pad voltage is coupled to the gate of M1 which causes a significant decrease in the overall trigger voltage ($V_{T1}$) of the NiGBT device. As values of $L_{CH}$ become increasingly smaller (e.g., 0.9 µm relative to a fixed length of 10 µm), the propensity increases for NiGBT circuit device 280 to exhibit a reduction in the trigger voltage $V_{T1}$ during an ESD event.

Figure 4:
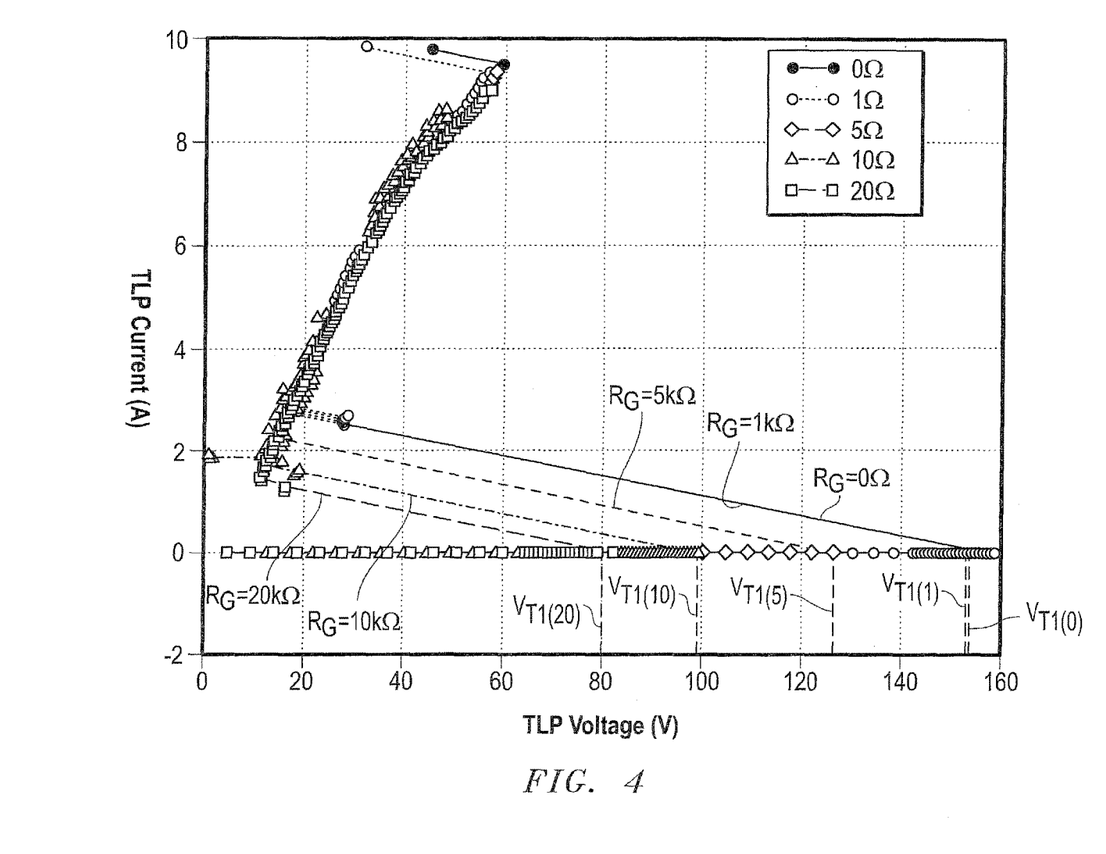
FIG. 4 illustrates relationship between current and voltage according to one exemplary embodiment of the disclosed circuitry and methods.

FIG. 4 is a plot of current versus resistance that illustrates how gate resistor $R_G$ of gate control circuit 295 may be sized to selectively decrease the trigger voltage $V_{T1}$ (i.e., by attenuating $C_{GS}$ and modulating the feedthrough ratio) to fit the unpowered voltage characteristics needed or desired for a NiGBT device 280 having a channel length ($L_{CH}$) of 0.9 µm. To obtain the data for FIG. 4, a 200 µm wide NiGBT circuit device 280 having the gate of its NMOS transistor M1 tied to ground through gate resistor $R_G$ was subjected to transmission line pulse (TLP) testing, in which 100 ns long pulses were applied to the NiGBT device 280 to trigger the NiGBT device 280 to discharge the current pulse. As shown in FIG. 4, baseline NiGBT trigger voltage $V_{T1(0)}$ for the case where the gate of NMOS M1 coupled with no $R_G$ resistance to ground is raised to about 155 volts. Little lowering in NiGBT trigger voltage $V_{T1(1)}$ is observed for the case where $R_G$ is 1 kΩ, which remains close to about 155 volts. However, NiGBT trigger voltage $V_{T1(5)}$ drops to about 125 volts for the case where $R_G$ is 5 kΩ, and drops further to about 98 volts for the case where $R_G$ is 10 kΩ Finally, NiGBT trigger voltage $V_{T1(20)}$ drops to about 80 volts for the case where $R_G$ is 20 kΩ. Thus, in one embodiment a given NiGBT device configuration (e.g., having a given selected channel length $L_{CH}$) may be empirically tested or otherwise evaluated (e.g., using simulation) to determine a relationship between varying resistance value of $R_G$ and corresponding NiGBT trigger voltage $V_{T1}$, from which the resistance of resistor $R_G$ may be selected to meet a desired or target NiGBT trigger voltage for unpowered circuit conditions.

It will be understood that the exemplary embodiments of FIGS. 2, 3 and 4 are exemplary only, and that other configurations of NiGBT device and/or gate control circuit may be employed to provide ESD protection for various types of integrated circuits. It will also be understood that the disclosed circuitry and methods may be implemented to protect at risk circuitry using insulated-gate bipolar transistor (IGBT) device circuitry having a variety of different channel lengths ($L_{CHs}$), such as using IGBT device circuitry having a $L_{CH}$ that is less than 10 microns, alternatively that is from about 0.5 micron to less than 10 microns, alternatively that is from about 0.5 micron to about 9 microns, alternatively that is from about 0.5 micron to about 8 microns, alternatively that is from about 0.5 micron to about 7 microns, alternatively that is from about 0.5 micron to about 6 microns, alternatively that is from about 0.5 micron to about 5 microns, alternatively that is from about 0.5 micron to about 4 microns, alternatively that is from about 0.5 micron to about 4 microns, alternatively that is from about 0.5 micron to about 3 microns, alternatively that is from about 0.5 micron to about 2 microns, alternatively that is from about 0.5 micron to about 1 micron, and alternatively that is about 0.9 micron, although use of IGBT device circuitry having a $L_{CH}$ that is less than about 0.5 microns or greater than or equal to about 10 microns is also possible.

It will be understood that a given IGBT device configuration having a given selected channel length $L_{CH}$ may be empirically tested or otherwise evaluated (e.g., using simulation) in one embodiment according to the methodology illustrated in FIG. 4 to determine a relationship between varying resistance value of $R_G$ and corresponding IGBT trigger voltage $V_{T1}$ for that particular $L_{CH}$ and IGBT device configuration, from which the resistance of resistor $R_G$ may be selected to meet a desired (or target) IGBT trigger voltage for unpowered circuit conditions. It will also be understood that the particular configuration of NMOSFET transistor elements of the circuitry embodiments described and illustrated herein are exemplary only, and may be replaced by equivalent complementary metal-oxide semiconductor (CMOS) circuitry in which PMOSFET and NMOSFET transistor switching elements are juxtaposed, as will be appreciated by one of ordinary skill in the art with the benefit of this disclosure.

Further, while the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed circuitry and methods may be utilized in various combinations and/or independently. Thus the invention is not limited to only those combinations shown herein, but rather may include other combinations.

What is claimed is:

1. A semiconductor circuit device, comprising:
   a signal pad;
   a first supply rail;
   a second supply rail of opposite polarity to the first supply rail and having an operating voltage of from 50 volts to 150 volts when the second supply rail is powered on;
   an output buffer circuitry coupled between the first and second supply rails, the signal pad being coupled to the output buffer circuitry;
   an insulated-gate bipolar transistor (IGBT) device having a silicon-on-insulator (SOI) device structure coupled to form an embedded parasitic silicon controlled rectifier (SCR) between the signal pad and the first supply rail;
   a resistor coupled in a first current path between a gate terminal of the IGBT device and the first supply rail, the gate terminal of the IGBT device being disposed at an outer surface of the SOI device structure; and
   a gate coupling switch coupled in a second current path between the gate terminal of the IGBT device and the first supply rail, the second current path being parallel to the first current path;
   where the gate coupling switch is configured to selectively couple the gate of the IGBT device to the first supply rail through the second current path to lower a resistance to current flow between the gate of the IGBT device and the first supply rail.

2. The circuit device of claim 1, where the IGBT device is configured to turn on to discharge current between the signal pad and the first supply rail only when a voltage between the signal pad and the first supply rail is greater than or equal to a trigger voltage threshold, the trigger voltage threshold being lower when the gate of the IGBT device is not coupled to the first supply rail by the gate coupling switch through the second current path than when the gate of the IGBT device is coupled to first supply rail through the second current path.

3. The circuit device of claim 1, further comprising a third supply rail of opposite polarity to the first supply rail, the third supply rail being coupled to the gate coupling switch, and the gate coupling switch being configured to turn on when the third supply rail is powered on relative to the first supply rail.

4. The circuit device of claim 1,
   where the IGBT device is configured to turn on to discharge current between the signal pad and the first supply rail only when a voltage between the signal pad and the first supply rail is greater than or equal to a trigger voltage threshold; and
   where the gate coupling switch is configured to selectively couple the gate of the IGBT device to the first supply rail through the second current path to raise the trigger voltage threshold of the IGBT device.

5. The circuit device of claim 1, where the first supply rail is a negative supply rail; where the IGBT circuit is a N-channel insulated-gate bipolar transistor (NiGBT) device; and where the second supply rail is a positive supply rail.

6. The circuit device of claim 5, further comprising a third supply rail coupled to the gate coupling switch, the third supply rail being a positive supply rail of lower positive voltage than the second supply rail and that is powered together with the second supply rail when the output buffer circuitry is powered on; and where the gate coupling switch is configured to turn on when the third supply rail is powered on to selectively couple the gate of the NiGBT device to the first supply rail through the second current path to raise the trigger voltage threshold of the NiGBT device, and is configured to turn off when the third supply rail is powered off to selectively decouple the gate of the NiGBT device from the first supply rail through the second current path to lower the trigger voltage threshold of the NiGBT device.

7. The circuit device of claim 5, where a trigger voltage threshold of the NiGBT device is higher than the operating voltage of the second supply rail when the gate coupling switch is turned on to couple the gate of the NiGBT device to the first supply rail through the second current path; and where the trigger voltage of the NiGBT device is less than the operating voltage of the second supply rail when the gate of the NiGBT device is not coupled by the gate coupling switch to the first supply rail through the second current path.

8. The circuit device of claim 1, where a channel length of the IGBT device is 0.9 microns.

9. The circuit device of claim 1, where the IGBT device is configured to respond to occurrence of an electrostatic discharge (ESD) event on the signal pad by discharging current between the signal pad and the first supply rail.

10. A method, comprising:
   operating a semiconductor circuit device that comprises:
      an insulated-gate bipolar transistor (IGBT) device having a silicon-on-insulator (SOI) device structure that is coupled to form an embedded parasitic silicon controlled rectifier (SCR) between a signal pad and a first supply rail of the circuit device, a resistor being coupled in a first current path between a gate terminal of the IGBT device and the first supply rail, and a gate coupling switch being coupled in a second current path between the gate terminal of the IGBT device and the first supply rail such that the second current path is parallel to the first current path with the gate terminal being disposed at an outer surface of the SOI device structure, and
      a second supply rail of opposite polarity to the first supply rail, and
      an output buffer circuitry coupled between the first and second supply rails with the signal pad being coupled to the output buffer circuitry;
   powering the second supply rail with an operating voltage of from 50 volts to 150 volts; and
   using the gate coupling switch to selectively couple the gate of the IGBT device to the first supply rail through the second current path to lower a resistance to current flow between the gate of the IGBT device and the first supply rail.

11. The method of claim 10, further comprising using the IGBT device to turn on to discharge current between the signal pad and the first supply rail only when a voltage between the signal pad and the first supply rail is greater than or equal to a trigger voltage threshold, the trigger voltage threshold being lower when the gate of the IGBT device is not coupled to the first supply rail by the gate coupling switch through the second current path than when the gate of the IGBT device is coupled to first supply rail through the second current path.

12. The method of claim 10, where the semiconductor circuit device further comprises a third supply rail of opposite polarity to the first supply rail, the third supply rail being coupled to the gate coupling switch; and where the method further comprises using the gate coupling switch to turn on when the third supply rail is powered on relative to the first supply rail.

13. The method of claim 10, further comprising:
   using the IGBT device to turn on to discharge current between the signal pad and the first supply rail only when a voltage between the signal pad and the first supply rail is greater than or equal to a trigger voltage threshold; and
   using the gate coupling switch to selectively couple the gate of the IGBT device to the first supply rail through the second current path to raise the trigger voltage threshold of the IGBT device.

14. The method of claim 10, where the first supply rail is a negative supply rail; where the IGBT device is a N-channel insulated-gate bipolar transistor (NiGBT) device; and where the second supply rail is a positive supply rail.

15. The method of claim 14, where the semiconductor circuit device further comprises a third supply rail coupled to the gate coupling switch, the third supply rail being a positive supply rail of lower positive voltage than the second supply rail and that is powered together with the second supply rail when the output buffer circuitry is powered on; and where the method further comprises:
   using the gate coupling switch to turn on when the third supply rail is powered on to selectively couple the gate of the NiGBT device to the first supply rail through the second current path to raise the trigger voltage threshold of the NiGBT device; and
   using the gate coupling switch to turn off when the third supply rail is powered off to selectively decouple the gate of the NiGBT device from the first supply rail through the second current path to lower the trigger voltage threshold of the NiGBT device.

16. The method of claim 14, where a trigger voltage threshold of the NiGBT device is higher than the operating voltage of the second supply rail when the gate coupling switch is turned on to couple the gate of the NiGBT device to the first supply rail through the second current path; and where the trigger voltage of the NiGBT device is less than the operating voltage of the second supply rail when the gate of the NiGBT device is not coupled by the gate coupling switch to the first supply rail through the second current path.

17. The method of claim 10, where a channel length of the IGBT device is 0.9 microns.

18. The method of claim 10, further comprising using the IGBT device to respond to occurrence of an electrostatic discharge (ESD) event on the signal pad by discharging current between the signal pad and the first supply rail.

19. The method of claim 10, further comprising performing the following steps prior to operating the semiconductor circuit device: first empirically testing the IGBT device configuration to determine a relationship between multiple different resistance values coupled in the first current path and corresponding different trigger voltage thresholds at which the IGBT device turns on to discharge current between the signal pad and the first supply rail; and then using the determined relationship to select a particular resistance value for the resistor coupled in the first current path that results in a desired trigger voltage threshold for the IGBT device.

20. The method of claim 15, further comprising powering the third supply rail with an operating voltage of 5 volts or less when the third supply rail is powered on with the second supply rail when the output buffer circuitry is powered on.

21. The circuit device of claim 3, where the first supply rail is a $V_{SS}$ rail, the second supply rail is a $V_{DDH}$ rail, and the third supply rail is a $V_{DDL}$ rail.

22. The circuit device of claim 6, where the third supply rail has an operating voltage of 5 volts or less when the third supply rail is powered on with the first supply rail when the output buffer circuitry is powered on.

23. A semiconductor circuit device, comprising:
a signal pad;
a first supply rail;
a second supply rail of opposite polarity to the first supply rail and having an operating voltage of from 100 volts to 200 volts when the second supply rail is powered on;
an output buffer circuitry coupled between the first and second supply rails, the signal pad being coupled to the output buffer circuitry;
an insulated-gate bipolar transistor (IGBT) device having a silicon-on-insulator (SOI) device structure coupled to form an embedded parasitic silicon controlled rectifier (SCR) between the signal pad and the first supply rail;
a resistor coupled in a first current path between a gate terminal of the IGBT device and the first supply rail, the gate terminal of the IGBT device being disposed at an outer surface of the SOI device structure; and
a gate coupling switch coupled in a second current path between the gate terminal of the IGBT device and the first supply rail, the second current path being parallel to the first current path;
where the gate coupling switch is configured to selectively couple the gate of the IGBT device to the first supply rail through the second current path to lower a resistance to current flow between the gate of the IGBT device and the first supply rail.

24. A method, comprising:
operating a semiconductor circuit device that comprises:
an insulated-gate bipolar transistor (IGBT) device having a silicon-on-insulator (SOI) device structure that is coupled to form an embedded parasitic silicon controlled rectifier (SCR) between a signal pad and a first supply rail of the circuit device, a resistor being coupled in a first current path between a gate terminal of the IGBT device and the first supply rail, and a gate coupling switch being coupled in a second current path between the gate terminal of the IGBT device and the first supply rail such that the second current path is parallel to the first current path with the gate terminal being disposed at an outer surface of the SOI device structure, and
a second supply rail of opposite polarity to the first supply rail, and
an output buffer circuitry coupled between the first and second supply rails with the signal pad being coupled to the output buffer circuitry;
powering the second supply rail with an operating voltage of from 100 volts to 200 volts; and
using the gate coupling switch to selectively couple the gate of the IGBT device to the first supply rail through the second current path to lower a resistance to current flow between the gate of the IGBT device and the first supply rail.

* * * * *